(12) United States Patent
Yang

(10) Patent No.: US 8,076,758 B2
(45) Date of Patent: Dec. 13, 2011

(54) WAFER STRUCTURE

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/971,386

(22) Filed: Dec. 17, 2010

(65) Prior Publication Data

US 2011/0089578 A1    Apr. 21, 2011

Related U.S. Application Data

(62) Division of application No. 11/768,007, filed on Jun. 25, 2007, now Pat. No. 7,880,274.

(51) Int. Cl.
*H01L 23/544* (2006.01)
(52) U.S. Cl. .. 257/659; 257/797; 257/660; 257/E23.179
(58) Field of Classification Search .................. 257/659, 257/660, 782, E23.179; 438/401, 622
See application file for complete search history.

(56) References Cited

U.S. PATENT DOCUMENTS

| 5,911,108 | A  | * | 6/1999 | Yen ............................ | 438/401 |
| 6,765,254 | B1 | * | 7/2004 | Hui et al. ..................... | 257/296 |
| 6,774,432 | B1 | * | 8/2004 | Ngo et al. .................... | 257/325 |
| 7,038,777 | B2 | * | 5/2006 | Kim et al. .................... | 356/401 |

* cited by examiner

*Primary Examiner* — Roy Potter
(74) *Attorney, Agent, or Firm* — J.C. Patents

(57) ABSTRACT

A wafer structure includes a plurality of dies, an edge portion, a passivation layer, and a UV-blocking metal layer. Each of the dies having an integrated circuit formed thereon, and the circuit includes an upmost metal layer that includes bonding pads. A composite dielectric layer corresponding to dielectric layers of the integrated circuit is disposed on the edge portion, and a cavity is formed in the composite dielectric layer over the edge portion. The passivation layer is located over the whole wafer and covers the upmost metal layer. The UV-blocking metal layer is located on the passivation layer and covers the edge portion and at least a portion of each of the dies. The cavity, the passivation layer, and the UV-blocking metal layer result in an alignment mark.

8 Claims, 2 Drawing Sheets

WAFER STRUCTURE

CROSS-REFERENCE TO RELATED APPLICATION

This application is a divisional application of and claims the priority benefit of an application Ser. No. 11/768,007, filed on Jun. 25, 2007, now allowed. The entirety of the above-mentioned patent application is hereby incorporated by reference herein and made a part of this specification.

BACKGROUND OF THE INVENTION

1. Field of the Invention

This invention relates to a structure resulting from an integrated circuit (IC) process. More particularly, this invention relates to a wafer structure resulting from a part of an IC process.

2. Description of the Related Art

In the fabricating process of an integrated circuit sensitive to UV-light, such as a non-volatile memory operated by carrier injection and removal, a UV-blocking metal layer is usually formed over the whole wafer after the passivation layer covering the upmost metal layer is formed. The openings exposing the bonding pads in the upmost metal layer are formed through the UV-blocking metal layer and the passivation layer.

FIGS. 1A and 1B illustrate a two-photo process in the prior art for defining the openings above the bonding pads of a non-volatile memory after a UV-blocking layer is formed screening the zero alignment mark on the wafer.

With reference to FIG. 1A, a wafer 100 including dies 102 and an edge portion 104 is provided, wherein only one die 102 is shown for simplicity. Each die 102 includes a periphery circuit area 106 and an array area 108, with a circuit of a non-volatile memory and the accompanying dielectric layers 120 thereon. The edge portion 104 is formed with a zero alignment 110 thereon, and is screened in the deposition of any conductive layer to be defined into a portion of the circuit so that only the dielectric layers 120 are formed thereon as a composite dielectric layer. An upmost metal layer, which includes bonding pads 130a within the periphery circuit area 106 and other upmost metal patterns 130b, has been formed on the dielectric layers 120, wherein only one bonding pads 130a is shown for simplicity. A passivation layer 140 has been formed over the whole wafer 100 covering the upmost metal layer, and a UV-blocking metal layer 150 has been formed over the whole passivation layer 140.

In the first stage of the two-photo process, a photoresist layer 160 is formed over the whole wafer 100, and then a portion thereof above the edge portion 104 is exposed and removed in subsequent development. The UV-blocking layer 150 thus exposed is then removed in an etching step 162 making the zero alignment mark 110 under the transparent layers 120 and 140 optically detectable.

After the photoresist layer 160 is removed, a water-resistant layer 170 is formed over the whole wafer 100 covering the remaining UV-blocking metal layer 150a. A photoresist layer 180 is formed over the whole wafer 100 and exposed by a photomask 10 to form an exposed region 180a over each bonding pad 130a. Because the zero alignment mark 110 under the transparent layers 120 and 140 is optically detectable, the wafer 100 can be aligned using an optical method based on the zero alignment mark 110 in the exposure using the photomask 10. After the exposed region 180a is removed in subsequent development, the photoresist layer 180 is used as an etching mask to form an opening through the a water-resistant layer 170, the UV-blocking metal layer 150 and the passivation layer 140 above the bonding pad 130a.

The above partial removal process for the UV-blocking metal layer 150 as shown in FIG. 1A needs an extra photomask, and the coating, exposure, development and so forth of the photoresist layer consume much time.

SUMMARY OF THE INVENTION

In view of the foregoing, the invention is directed to a wafer structure that can be formed by performing a part of an integrated circuit process that incorporates steps of a method of enabling alignment of a wafer in at least one exposure step of the integrated circuit process after a UV-blocking metal layer is formed over the whole wafer.

The wafer structure of this invention includes a plurality of dies, an edge portion where a composite dielectric layer corresponding to the dielectric layers of an integrated circuit is disposed, a passivation layer and a UV-blocking metal layer. Each die has the integrated circuit formed thereon, wherein the integrated circuit includes an upmost metal layer that includes bonding pads. A cavity is formed in the composite dielectric layer over the edge portion. The passivation layer is over the whole wafer covering the upmost metal layer, and the UV-blocking metal layer on the passivation layer covering the edge portion and at least a portion of each of the dies. The cavity, the passivation layer and the UV-blocking metal layer result in an alignment mark.

By utilizing the method of this invention, a new alignment mark can be formed on the wafer edge portion with a zero alignment mark when the UV-blocking metal layer is formed, so that the wafer can be aligned in a subsequent exposure step even though the UV-blocking metal layer entirely screens the zero alignment mark.

It is to be understood that both the foregoing general description and the following detailed description are exemplary, and are intended to provide further explanation of the invention as claimed.

BRIEF DESCRIPTION OF THE DRAWINGS

FIGS. 2A and 2B illustrate a non-volatile memory process according to a first embodiment of this invention, wherein FIG. 2A illustrates how to enable alignment of the wafer after the UV-blocking layer is formed screening the zero alignment mark.

DESCRIPTION OF THE PREFERRED EMBODIMENTS

It is noted that the following two embodiments are intended to further explain this invention but are not to restrict the scope of this invention. Though the integrated circuit exemplified in each of the embodiments is a non-volatile memory of charge-trapping type operated by carrier injection and removal, this invention can be applied to the fabricating process of any other integrated circuit which is sensitive to UV-light and requires a UV-blocking metal layer formed thereover.

First Embodiment

Figure 1A:
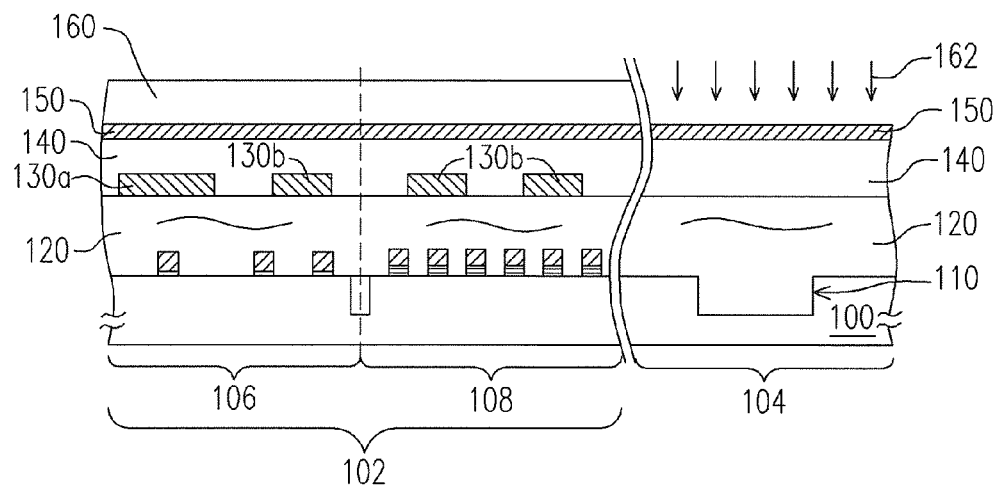
FIGS. 1A and 1B illustrate a two-photo process in the prior art for defining the openings above the bonding pads of a non-volatile memory after a UV-blocking metal layer is formed screening the zero alignment mark.
Figure 1B:
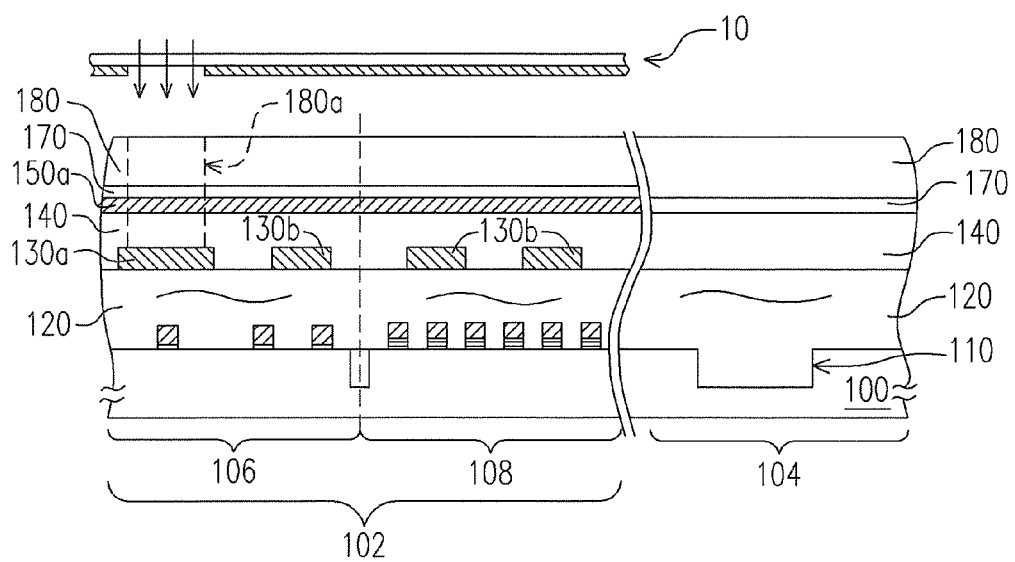
Figure 2A:
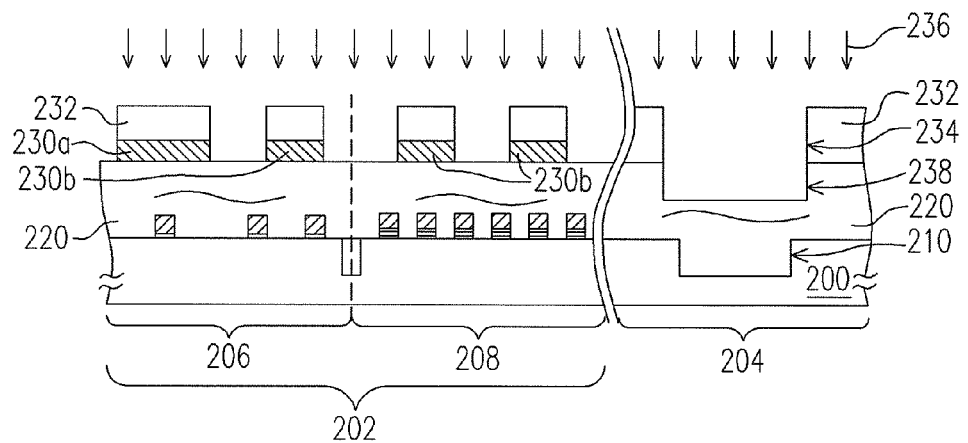
Figure 2B:
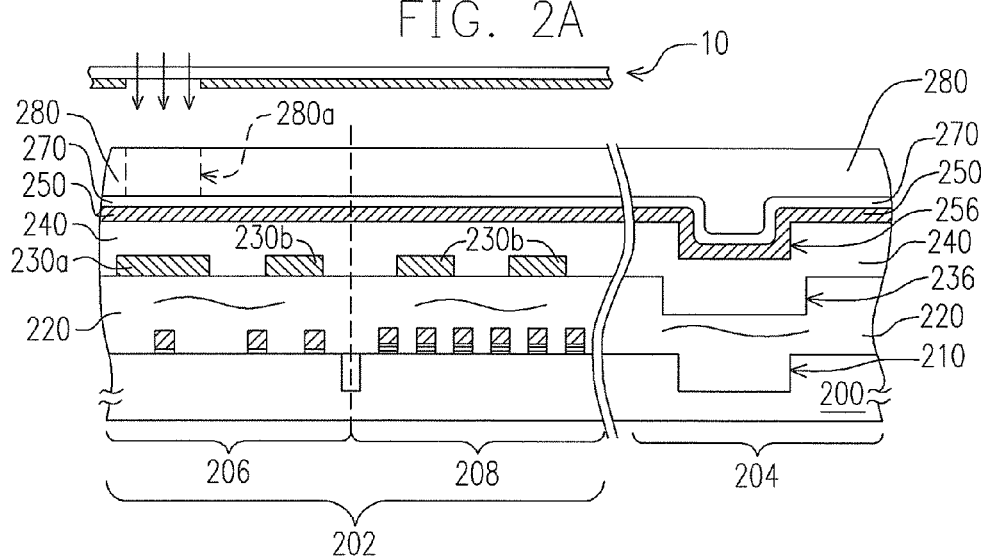

FIGS. 2A and 2B illustrate a non-volatile memory process according to the first embodiment of this invention, wherein FIG. 2A illustrates how to enable alignment of the wafer after the UV-blocking layer is formed screening the zero alignment mark.

Referring to FIG. 2A, a wafer 200 including a plurality of dies 202 and an edge portion 204 is provided, wherein the wafer 200 is possibly a single-crystal silicon wafer and only one die 202 is shown for simplicity. Each die 202 includes a periphery circuit area 206 and an array area 208, with the circuit of a non-volatile memory except the upmost metal layer and corresponding dielectric layers 220 thereon. The edge portion 204 is formed with a zero alignment mark 210 thereon, and is screened in the deposition of any conductive layer to be defined into a portion of the circuit so that only the dielectric layers 220 are formed thereon to be a composite dielectric layer.

An unpatterned upmost metal layer as the precursor of the layers 230a and 230b in FIG. 2A, which may be an aluminum layer of 3000 to 12000 angstroms thick, is deposited over the dies 202. A patterned photoresist layer 232 having the patterns of the upmost metal layer to be defined and having an opening 234 therein over the edge portion 204 of the wafer 200 is formed over the wafer 200. An etching step 236 is conducted using the photoresist layer 232 as a mask to define the unpatterned upmost metal layer into a patterned one, which includes bonding pads 230a in the periphery circuit area 206 and other upmost metal patterns 230b, and simultaneously form a cavity 238 in the dielectric layers 220 as a composite dielectric layer, wherein only one bonding pad 230a is shown for simplicity.

In certain embodiments, the etching rate of the dielectric layers 220 is about 1/3 of the etching rate of the upmost metal layer, so that the cavity 238 can be formed deeply enough to result in an effective alignment mark later.

Referring to FIG. 2B, after the bonding pads 230a, the metal patterns 230b and the cavity 238 are formed, the photoresist layer 232 is removed. A passivation layer 240 is formed over the whole wafer 200 covering the bonding pads 230a and the metal patterns 230b. The passivation layer 240 may include polyamide or an epoxy resin, and the thickness thereof may range from 10000Å to 20000Å. A UV-blocking metal layer 250, such as a tungsten or AlCu layer, is then formed over the whole wafer 200, so as to prevent the memory cells from being irradiated by UV-light and injected with electrons. The thickness of the UV-blocking metal layer 250 may range from 3000Å to 8000Å.

The passivation layer 240 is formed in a manner such that the topography of the surface of the dielectric layer 220 is substantially retained, making the passivation layer 240 also have a cavity therein over the cavity 238. The UV-blocking metal layer 250 is formed substantially conformal to the surface of the passivation layer 240, so that a new alignment mark 256 is formed when the UV-blocking metal layer 250 is formed. Although the alignment mark 256 is above the zero alignment mark 210 in the figure, the former may alternatively be not above the latter if only the data of the preset location of the alignment mark 256 is stored in the wafer alignment system.

In addition, a water-resistant layer 270 may optionally be formed over the whole wafer 200 after the UV-blocking layer 250 is formed. The water-resistant layer 270 may include silicon oxynitride (SiON) or silicon nitride (SiN), and may have a thickness of 4000Å to 9000Å.

A photolithography process is then conducted, wherein a photoresist layer 280 is formed over the whole wafer 200 and then exposed with a photomask 10 to form an exposed region 280a over the bonding pad 230a. Since a new alignment mark 256 is formed when the UV-blocking metal layer 250 is formed, the wafer 200 can be aligned using an optical method based on the alignment mark 256 in the above exposure step. The exposed region 280a will be removed in later development to form a corresponding opening in the photoresist layer 280.

Then, an opening is formed through the water-resistant layer 270, UV-blocking metal layer 250 and the passivation layer 240 using the patterned photoresist layer 280 as a mask, as indicated by the dashed lines in FIG. 2B that also show the border of the resulting opening. When no water-resistant layer is formed on the UV-blocking metal layer 250, the opening is formed through the UV-blocking layer 250 and the passivation layer 240 only.

The process after the patterned photoresist layer 280 is removed can be any one known in the prior art. For example, a spacer is preferably formed on the sidewall of the resulting opening to prevent the bonding pads 230a from electrically connecting with each other via the conductive UV-blocking layer 250, and a gold wire or a solder ball is then bonded onto each bonding pad 230a exposed in the resulting openings.

Since a new alignment mark is formed on the wafer edge portion with a zero alignment mark when the UV-blocking metal layer is formed, the wafer can be aligned in the exposure step for defining the openings above the bonding pads even after the UV-blocking metal layer is formed screening the zero alignment mark.

Second Embodiment

Figure 3:
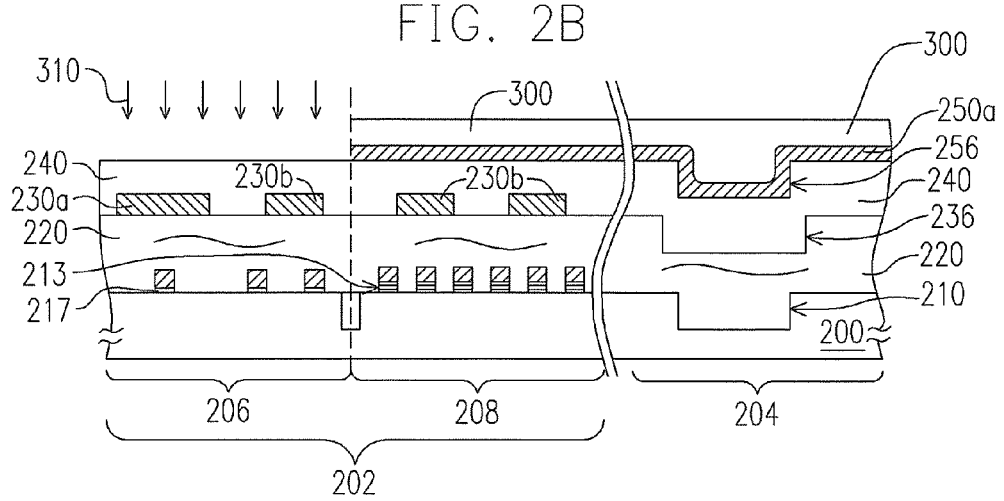
FIG. 3 depicts an additional patterning step for the UV-blocking metal layer in a non-volatile memory process according to a second embodiment of this invention.

FIG. 3 depicts an additional patterning step for the UV-blocking metal layer in a non-volatile memory process according to the second embodiment of this invention.

The process of the second embodiment is similar to that of the first one, except that the UV-blocking metal layer 250 over the periphery circuit area 206 of each die 202 is removed. The removal can be done directly after the UV-blocking metal layer 250 is formed, in an etching step 310 that uses a patterned photoresist layer 300 exposing the periphery circuit area 206 of each die 202 as a mask.

In cases where each memory cell is disposed with a charge-trapping layer like an ONO composite layer to store data, the photomask for defining the patterned photoresist layer 300 may be the one for removing the charge-trapping layer 213 in the periphery circuit area 206. In such a case, the gate dielectric layer 217 of the transistors in the periphery circuit area 206 is formed after the charge-trapping layer 213 in the periphery circuit area 206 is removed.

After the photoresist layer 300 is removed, as in the case of the first embodiment shown in FIG. 2B, a water-resistant layer may be further foamed over the whole wafer 200 covering the remaining UV-blocking layer 250a. A lithography process is then conducted using the same photomask 10 to form an opening through the passivation layer 240, or through the water-resistant layer and the passivation layer 240 as a water-resistant layer is further form, over each bonding pad 230a in the periphery circuit area 206. Since there is no UV-blocking metal layer in the periphery circuit area 206, no spacer has to be formed on the sidewall of each opening exposing a bonding pad 230a to prevent electrical short.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A wafer structure comprising:
a plurality of dies, each of the dies having an integrated circuit formed thereon, wherein the circuit includes an upmost metal layer that includes bonding pads;
an edge portion where a composite dielectric layer corresponding to dielectric layers of the integrated circuit is disposed, wherein a cavity is formed in the composite dielectric layer over the edge portion;
a passivation layer over the whole wafer, covering the upmost metal layer; and
a UV-blocking metal layer on the passivation layer, covering the edge portion and at least a portion of each of the dies, wherein the cavity, the passivation layer, and the UV-blocking metal layer result in an alignment mark.

2. The wafer structure of claim 1, further comprising a water-resistant layer over the whole wafer covering the UV-blocking metal layer.

3. The wafer structure of claim 1, wherein the integrated circuit comprises a non-volatile memory.

4. The wafer structure of claim 3, wherein
each of the dies includes an array area and a peripheral circuit area,
the bonding pads are within the peripheral circuit area, and
the UV-blocking metal layer does not overlap the peripheral circuit area of each of the dies.

5. The wafer structure of claim 4, further comprising a water-resistant layer over the whole wafer covering the UV-blocking metal layer.

6. The wafer structure of claim 5, wherein the water-resistant layer comprises or silicon oxynitride (SiON) or silicon nitride (SiN).

7. The wafer structure of claim 1, wherein a zero alignment mark is formed on the edge portion of the wafer, and the alignment mark resulting from the cavity, the passivation layer and the UV-blocking metal layer is or is not above the zero alignment mark.

8. The wafer structure of claim 1, wherein the UV-blocking metal layer comprises tungsten or AlCu.

* * * * *